(12) United States Patent
Spreckelsen et al.

(10) Patent No.: US 7,228,722 B2
(45) Date of Patent: Jun. 12, 2007

(54) METHOD OF FORMING SPUTTERING ARTICLES BY MULTIDIRECTIONAL DEFORMATION

(75) Inventors: Eric Von Spreckelsen, Douglassville, PA (US); Christopher A. Michaluk, Gilbertsville, PA (US); Robert B. Ford, Washington Court House, OH (US)

(73) Assignee: Cabot Corporation, Boston, MA (US)

( * ) Notice: Subject to any disclaimer, the term of this patent is extended or adjusted under 35 U.S.C. 154(b) by 0 days.

(21) Appl. No.: 10/859,456

(22) Filed: Jun. 2, 2004

(65) Prior Publication Data

US 2005/0034503 A1 Feb. 17, 2005

Related U.S. Application Data

(60) Provisional application No. 60/476,984, filed on Jun. 9, 2003.

(51) Int. Cl.
*B21D 31/00* (2006.01)
*C22C 27/02* (2006.01)
*C23C 14/00* (2006.01)

(52) U.S. Cl. .................. 72/377; 148/422; 204/192.1

(58) Field of Classification Search ............ 72/377, 72/364; 204/298.01, 192.1; 148/422, 564, 148/668, 670, 681, 684, 692, 696
See application file for complete search history.

(56) References Cited

U.S. PATENT DOCUMENTS

| | | | |
|---|---|---|---|
| 4,721,537 A | 1/1988 | Ghosh | 148/12.7 |
| 4,844,746 A | 7/1989 | Hörmann et al. | 148/2 |
| 5,390,518 A | 2/1995 | Morimoto et al. | 72/10 |
| 5,615,465 A | 4/1997 | Broussoux et al. | 29/1.21 |
| 5,647,923 A | 7/1997 | Buescher | 148/672 |
| 6,193,821 B1 | 2/2001 | Zhang | 148/668 |
| 6,238,494 B1 | 5/2001 | Segal | 148/421 |
| 6,312,642 B1 | 11/2001 | Fife | 419/30 |
| 6,331,233 B1 | 12/2001 | Turner | 204/298.13 |
| 6,348,113 B1 | 2/2002 | Michaluk et al. | 148/668 |
| 6,348,139 B1 | 2/2002 | Shah et al. | 204/298.13 |
| 6,569,270 B2 | 5/2003 | Segal | 148/670 |
| 2002/0026965 A1 | 3/2002 | Michauluk et al. | 148/422 |
| 2002/0063056 A1 | 5/2002 | Shah et al. | 204/298.13 |
| 2002/0072475 A1 | 6/2002 | Michaluk et al. | 505/100 |
| 2002/0112789 A1 | 8/2002 | Jepson et al. | 148/422 |
| 2002/0125128 A1 | 9/2002 | Turner | 204/298.13 |
| 2002/0153071 A1 | 10/2002 | Segal et al. | 148/684 |
| 2002/0153248 A1 | 10/2002 | Shah et al. | 204/298.13 |
| 2003/0019746 A1 | 1/2003 | Ford et al. | 204/298.13 |
| 2003/0037847 A1 | 2/2003 | Michaluk et al. | 148/422 |
| 2003/0089429 A1 | 5/2003 | Koenigsmann et al. | 148/422 |
| 2003/0168131 A1 | 9/2003 | Michaluk et al. | 148/422 |
| 2004/0016635 A1 | 1/2004 | Ford et al. | 204/192.1 |

OTHER PUBLICATIONS

International Search Report for PCT/US2004/017972.
Written Opinion for PCT/US2004/017972.

*Primary Examiner*—Lowell A. Larson
*Assistant Examiner*—Teresa M. Bonk

(57) ABSTRACT

A method of producing a valve metal mill form having dimensions sufficient to be divided to form a plurality of sputter targets is described. The method includes multidirectional deformation of an ingot to form a mill form having a preferred average grain size of about 100 microns or less and/or a texture substantially void of textural bands.

37 Claims, 5 Drawing Sheets

METHOD OF FORMING SPUTTERING ARTICLES BY MULTIDIRECTIONAL DEFORMATION

This application claims the benefit under 35 U.S.C. §119 (e) of prior U.S. Provisional Patent Application No. 60/476,984 filed Jun. 9, 2003, which is incorporated in its entirety by reference herein.

BACKGROUND OF THE INVENTION

The present invention relates to metal billets, slabs, rods, and sputter targets. More particularly, the present invention relates to a method of producing a valve metal having a uniform fine grain size and a homogeneous microstructure that has dimensions sufficient for dividing into multiple slabs or billets for use in sputter targets and other objects.

Certain observable properties of sputter targets and sputter target materials are desirable for enhancing the sputtering performance of valve metal sputter targets (See, e.g., Michaluk, "Correlating Discrete Orientation and Grain Size to the Sputter Deposition Properties of Tantalum," *JEM*, January, 2000; Michaluk, Smathers, and Field, *Twelfth International Conference on Texture of Materials*, J. A. Szpunar (ed.), National Research Council of Canada, 1999, p. 1357). Fine grain size and homogeneous microstructure that is substantially free of sharp texture bands are examples of such properties. Grain size, grain uniformity, and textural homogeneity of metal material, generally, and of target material in particular, are measurable qualities, by methods described, for example, in U.S. Pat. No. 6,462,339 B1 (Michaluk et al.), incorporated herein in its entirety by reference.

Hence, an ongoing interest exists in relevant markets to develop processes for producing high purity sputter targets having the above-described metallurgical and textural qualities. Conventional metalworking multi-step sequences incorporating forging and/or rolling steps, combined with one or more intermediate annealing steps as well as one or more cleaning steps, are typically used in manufacturing suitable mill forms and are generally described by C. Pokross, "Controlling the Texture of Tantalum Plate," *Journal of Metals*, October 1989, pp. 46–49; and J. B. Clark, R. K. Garrett, Jr., T. L. Jungling, R. I. Asfahani, "Influence of Transverse Rolling on the Microstructural and Textural Development in Pure Tantalum," *Metallurgical Transactions A*, 23A, pp. 2183–91, which are incorporated herein in their entirety by reference. An example of a multi-step forging, cleaning, annealing, and rolling process to produce a tantalum sputter target having fine grain size and a homogeneous texture is described in U.S. Pat. No. 6,348,113 (Michaluk et al.), incorporated herein in its entirety by reference.

At least one disadvantage of conventional sputter target manufacturing methods is a limited yield of sputter targets per product lot. Limited-quantity production of sputter targets has at least two drawbacks. First, it can be quite time-consuming and costly. That is, as shown in the present invention, target manufacturing efficiency can be achieved by simultaneous target material production, as well as by formation of oversized target-grade plates suitable for bonding to a backing plate and subsequent partitioning into multiple sputtering target assemblies. Another drawback concerns quality control. Variables in metalworking operations affecting target material properties can lead to variation in the metallurgical and textural qualities of serially produced sputter targets.

Accordingly, a need exists for a method to produce a sputter target material having superior metallurgical and textural qualities, and to reduce the costs associated with production of sputter targets exhibiting such qualities.

SUMMARY OF THE PRESENT INVENTION

It is therefore a feature of the present invention to provide a method of producing a valve metal having uniform fine grain size and textural homogeneity and of dimensions sufficient for dividing into multiple billets, slabs, or sputter targets.

Another feature of the present invention is to provide a process for multidirectional deformation of a valve metal ingot.

A further feature of the present invention is to provide a large-scale manufacturing process for producing sputter targets.

Additional features and advantages of the present invention will be set forth in part in the description that follows, and in part will be apparent from the description, or may be learned by practice of the present invention. The objectives and other advantages of the present invention will be realized and attained by means of the elements and combinations particularly pointed out in the description and appended claims.

To achieve these and other advantages, and in accordance with the purposes of the present invention, as embodied and broadly described herein, the present invention relates to a method of producing a valve metal material having dimensions sufficient to be divided to form a plurality of sputter targets. The method involves multidirectional deformation of an ingot to form a mill form having an average grain size of less than about 50 microns, and a uniform texture having no textural bands, and optionally partitioning the mill form to form a number of rolling slabs or billets. The method includes a first deforming of an ingot to form a preform slab having a first dimension, a second dimension normal to the first dimension, and a third dimension normal to the second dimension that is less than both the first and second dimensions; and a second deforming of the preform slab by increasing the third dimension and decreasing the second dimension such that the second dimension is made to be less than the third dimension to form an intermediate slab. The method optionally includes partitioning the intermediate slab to form a plurality of rolling slabs. The method also optionally includes annealing the valve metal after the first deformation, after the second deformation, or after each of the first and second deformations.

The present invention further relates to a mill form having dimensions sufficient to be divided to form a plurality of sputter targets and having an average grain size of from about 100 to 50 microns or less.

It is to be understood that both the foregoing general description and the following detailed description are exemplary and explanatory only and are intended to provide a further explanation of the present invention, as claimed.

The accompanying drawings, which are incorporated in and constitute a part of this application, illustrate various aspects of the present invention and together with the description, serve to explain the principles of the present invention.

DETAILED DESCRIPTION OF THE PRESENT INVENTION

Figure 1A:
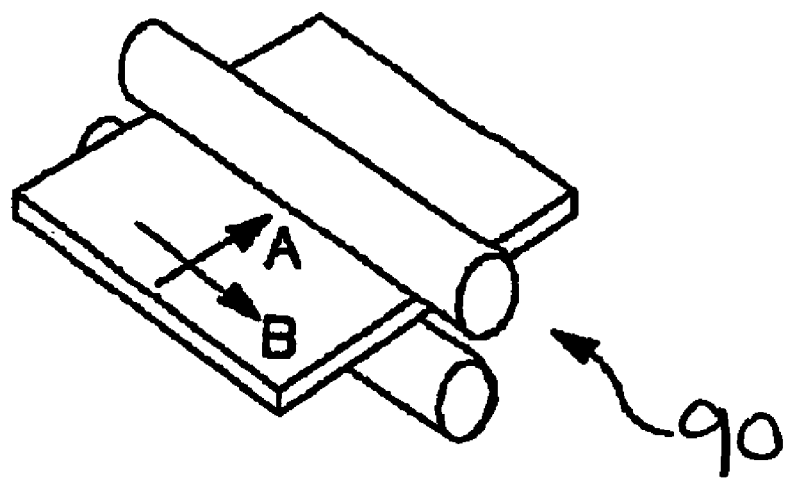
FIGS. 1*a* and 1*b* illustrate a transverse rolling process.

The present invention relates to a method of producing a multidirectionally deformed valve metal having dimensions sufficient to be divided to form a plurality slabs, billets, and the like, which can then be formed into multiple sputter targets. The valve metal can have superior metallurgical and textural qualities. Preferably, the valve metal has a uniform fine grain size and a homogeneous microstructure. For example, the valve metal can have an average grain size of less than about 100 microns and a texture that is substantially void of (100) textural bands.

A method according to the present invention involves producing a valve metal having dimensions sufficient to be divided to form a plurality of performs, like slabs and billets, which can be formed in sputter targets. The method involves multidirectional deformation of a valve metal ingot into a metal mill form having an average grain size of less than about 250 microns and a texture substantially void of (100) textural bands, and partitioning the mill form to form a plurality of rolling slabs or billets which can then be thermo-mechanically processed to form multiple sputter targets preferably having a uniform fine grain size and a homogeneous microstructure. An optional step of annealing the metal can be performed at various points in the deformation process.

For purposes of the present invention, valve metals generally include tantalum, niobium, and alloys thereof, and also may include metals of Groups IVB, VB, and VIB, and aluminum and copper, and alloys thereof. Valve metals are described, for example, by Diggle, in "Oxides and Oxide Films," Vol. 1, pp. 94–95, 1972, Marcel Dekker, Inc., New York, incorporated in its entirety by reference herein. Valve metals are generally extracted from their ores and formed into powders by processes that include chemical reduction, as described for example, in U.S. Pat. No. 6,348,113, by a primary metal processor. Further metal refining techniques typically performed by a primary metal processor include thermally agglomerating the metal powder, deoxidizing the agglomerated metal powder in the presence of a getter material, and then leaching the deoxidized metal powder in an acid leached solution, as disclosed, for example, in U.S. Pat. No. 6,312,642. A primary metal processor can then subject the valve metal powder or melt feedstock to an electron beam or to vacuum arc melting or other melting technique to cast or form a metal ingot.

According to one embodiment of the present invention, the multidirectionally deformed valve metal has dimensions sufficient to be divided to form a plurality of sputter targets, and preferably one or more test or quality control samples. The valve metal can be any shape, and is preferably substantially in the shape of a rectangle. Preferably, the rectangle is 42 inches by 84 inches, 20 inches by 84 inches, or 24 inches by 36 inches. Preferably, the valve metal has a thickness of from about 0.1 to about 0.5 inches, and more preferably, from about 0.25 to about 0.35 inches.

With respect to a first deforming of an ingot to form a preform slab, any method can be used to deform the ingot, and preferably the first deforming is achieved by forging or rolling the ingot. The preform slab can have any shape, and is preferably substantially in the shape of a rectangle having a first dimension, e.g., length, a second dimension normal to said first dimension, e.g., width, and a third dimension normal to the second dimension, e.g., thickness, that is less than both the first and second dimensions. The first deforming can be achieved by flat forging the ingot perpendicular to its centerline such that the first dimension (length) of the preform slab is parallel to the centerline of the ingot. For purposes of the present invention, the step of first deforming represents deformation in a first direction.

The step of second deforming the preform slab can be achieved by any method, and is preferably achieved by forging. According to one embodiment of the present invention, the second deforming of the preform slab increases the third dimension (thickness), and decreases the second dimension (width) such that the second dimension is made to be less than the third dimension to thereby form an intermediate slab. According to one embodiment of the present invention, the second deforming can decrease the second dimension by about 25 to about 80%. The second deforming can be achieved by press forging, for example. The first dimension can remain substantially the same or be increased by the second deforming. For purposes of the present invention, the second deforming represents deformation of the valve metal in a second direction. Thus, the combined steps of first deforming and second deforming represent multidirectional deforming of the valve metal.

Figure 2:
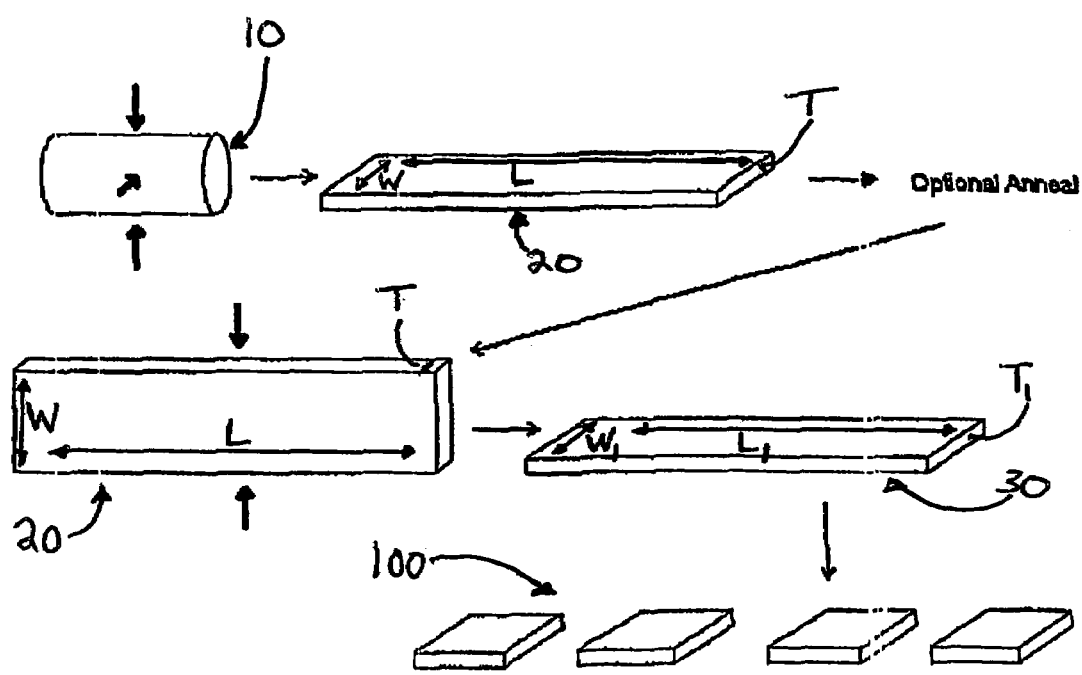
FIG. 2 is a schematic representation of a multidirectional deformation process according to one embodiment of the present invention.
Figure 3:
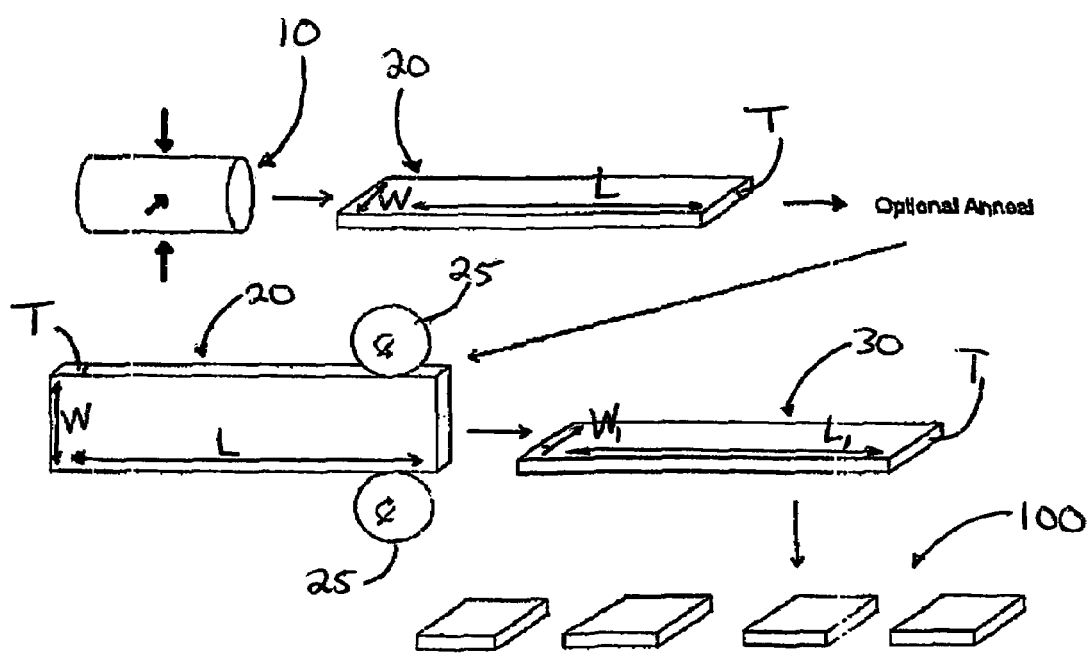
FIG. 3 is a schematic representation of a multidirectional deformation process according to one embodiment of the present invention.

FIG. 2 shows one embodiment of multidirectional deformation of a valve metal ingot 10, for example, tantalum or niobium, to yield rolling slabs 100 according to one embodiment of the present invention. The valve metal ingot 10 can be first deformed, by forging, for example (e.g., as indicated by arrows), to form a preform slab 20. The preform slab 20 can be in the shape of a rectangle having a first dimension L, a second dimension W normal to said first dimension L, and a third dimension T normal to the second dimension W, that is less than both the first dimension L and the second dimension W. The preform slab 20 can be optionally annealed as discussed in more detail below. The preform slab 20 can be side forged, for example (e.g., as indicated by arrows), such that the third dimension T is made larger than the second dimension W to form an intermediate slab 30. The intermediate slab 30 can be in the shape of a rectangle having a first dimension $L_1$, a second dimension $W_1$ normal to said first dimension $L_1$, and a third dimension $T_1$, normal to the second dimension $W_1$, that is less than both the first dimension $L_1$ and the second dimension $W_1$. In the second deformation, T can be transformed into $W_1$, while simultaneously W can be transformed into $T_1$. The rolling slabs 100 can be further processed into sputter targets as described in of U.S. Pat. No. 6,348,113 B1 (Michaluk et al.) and in U.S. Patent Application Publication Nos. U.S. 2003/0037847 A1; 2003/0019746 A1; 2002/0157736 A1; 2002/0072475 A1; and 2002/002695 A1, incorporated in their entirety herein by reference. The sputter targets or target blanks can be, for example, planar or cylindrical (e.g., hollow cathode magnetron), and can further be bonded to a backing plate.

Figure 4:
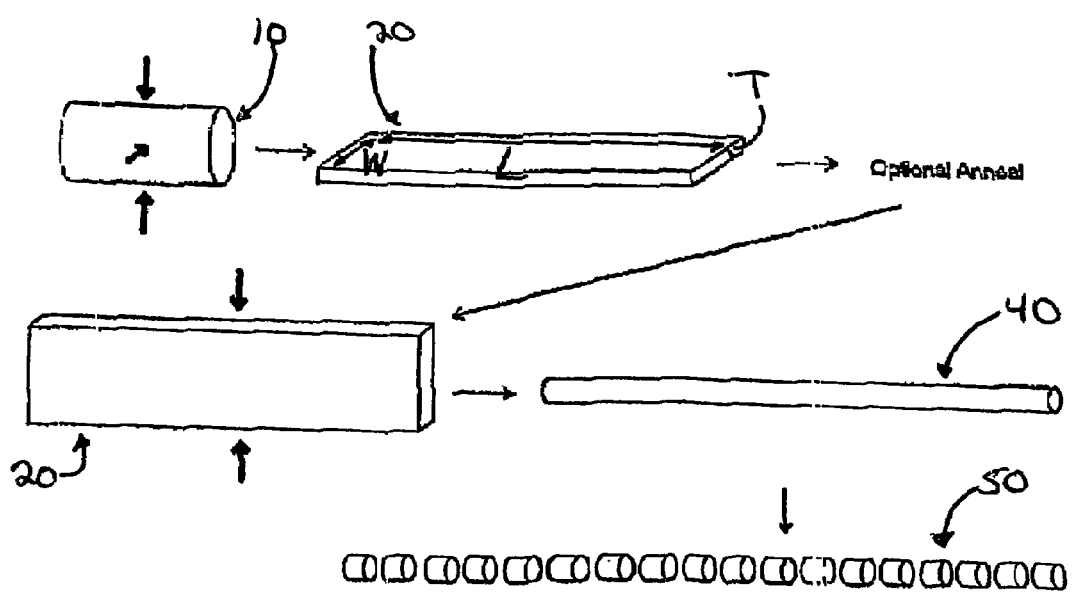
FIG. 4 is a schematic representation of a multidirectional deformation process according to one embodiment of the present invention.

According to another embodiment, the second deforming can be achieved by bloom rolling the preform slab, preferably using a bloom mill. FIG. 4 shows one embodiment of the present invention in which the second deforming is achieved by bloom rolling the preform slab 20, preferably using a bloom mill 25.

Multidirectional deformation of a valve metal according to the present invention produces an intermediate slab having an average grain size of less than about 250 microns and a texture that is substantially void of (100) textural bands. The intermediate slab preferably has an average grain size of from about 100 to about 150 microns, or more preferably of 50 microns or less.

Figure 1B:
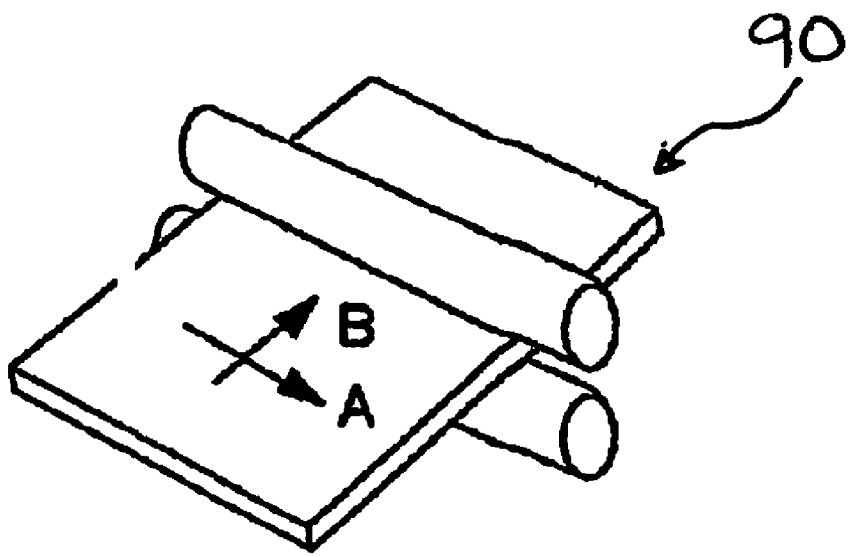

Multidirectionally deforming the valve metal according to the present invention can be contrasted to transverse rolling of a slab in more than one direction, for example, as illustrated in FIGS. 1a and 1b. In a transverse rolling process, the metal workpiece 90 is rolled in a first direction (A), and then rolled in a second direction (B) that is perpendicular to the first direction (A), such that the length and width are increased while the smallest dimension (e.g., thickness) is decreased. Thus, transverse rolling has the effect of flattening a metal work piece to a desired thickness without producing the substantial changes to the microstructure of metal 90 brought about by the multidirectional deformation process of the present invention. Multidirectionally deforming the valve metal according to the present invention also differs from redundant forging that restores or substantially restores a metal workpiece to a previous form, as shown, for example, in U.S. Patent Application Publication No. US2002/0112789 A1.

One embodiment of the present invention, further involves partitioning the intermediate slab to form a plurality of rolling slabs that can be further thermomechanically processed into plates or other shapes suitable for forming sputter targets. Partitioning can be achieved by separating the intermediate slab into a predetermined number of rolling slabs of predetermined shapes. Partitioning can be by, for example, cutting, machining, waterjet cutting, punch pressing, plasma cutting, flame cutting, milling, grinding, sawing, laser cutting, boring, electrode discharge machining, or any combination thereof. One or more of the rolling slabs can be particularly sized for use as a test or a quality control sample. The rolling slab can have an average grain size of from about 250 to about 100 microns, and preferably, from about 150 to about 100 microns, and more preferably, of 50 microns or less, substantially throughout its thickness as measured by orientation imaging microscopy (OIM) or other suitable techniques.

One embodiment of the present invention includes the further step of annealing the preform slab to achieve at least partial recrystallization. Annealing is preferably achieved in a vacuum of $5 \times 10^{-4}$ torr or higher, and at a sufficient temperature and for a sufficient time to ensure recovery or complete recrystallization of the preform slab. Preferably, the annealing temperature is from about 950 to about 1300° C., though other temperatures can be used. The annealing time is preferably for about 1 to about 8 hours, though other annealing times can be used. Preferably, the preform slab is annealed at a temperature of about 1050° C. for a time of about 2 hours. Optionally, the intermediate slab can be annealed instead of, or in addition to annealing the preform slab. Annealing of the intermediate slab can be achieved substantially as described for the preform slab.

According to one embodiment of the present invention, the step of second deforming the preform slab forms a preform substantially in the shape of a rod, and further includes partitioning the rod to form a plurality of billets. Partitioning of the rod can be by any method such as those described above. The billets can be of any predetermined length suitable for further thermomechanical processing into plates or other mill forms suitable for forming other targets in the shape of discs, cylinders, or various other shapes. FIG. 4 shows one embodiment of multidirectional deformation of a valve metal, for example, a tantalum or niobium ingot to yield a rod 40. The rod can then be cut into billets 50 suitable for processing in accordance to with U.S. Pat. No. 6,348,113 B1 (Michaluk et al.). Optionally, the rod can be annealed before being cut into billets.

One embodiment of the present invention involves partitioning of the preform slab transversely to its first dimension to form a plurality of intermediate slabs. As a result, individual intermediate slabs have a first dimension that is less than the first dimension of the preform slab, a second dimension normal to the first dimension of the intermediate slab, and a third dimension normal to the second dimension of the intermediate slab that is less than both the first dimension and the second dimension of the preform slab. The method further includes a second deforming of at least one of the intermediate slabs by increasing the third dimension of the intermediate slab and decreasing its first dimension such that the first dimension of the intermediate slab is made to be less than its third dimension thereby forming a rolling slab. The first and second deforming steps represent multidirectional deformation of the ingot. Preferably the rolling slab has an average grain size of about 100 microns or less or about 50 microns or less, and/or a texture that is substantially void of textural bands, such as (100) textural bands. The texture can be a primary (111), or a primary (100) texture, or a mixed (111) (100) texture, wherein all of which are preferably uniform on the surface and/or throughout the thickness. Optionally, the preform slab, the intermediate slab, or both can be annealed one or more times.

Figure 5:
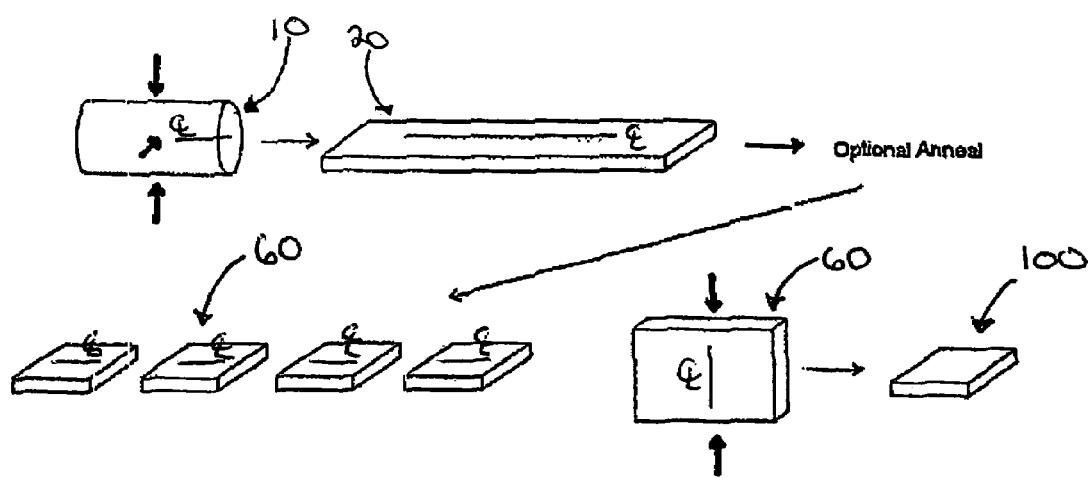
FIG. 5 is a schematic representation of a multidirectional deformation process according to one embodiment of the present invention.

FIG. 5 shows an embodiment of the present invention in which partitioning of the preform slab 20 transversely to its first dimension forms a plurality of intermediate slabs 60. As a result, individual intermediate slabs 60 have a first dimension that is less than the first dimension of the preform slab 20, a second dimension normal to the first dimension of the intermediate slab 20, and a third dimension normal to the second dimension of the intermediate slab 20 that is less than both the first dimension and the second dimension of the preform slab 20. The method further includes a second deforming of at least one of the intermediate slabs 20 by increasing the third dimension of the intermediate slab 20 and **decreasing its first dimension such that the first dimension of the intermediate slab 20 is made to be less than its third dimension thereby forming a rolling slab 100.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

What is claimed is:

1. A method of producing a multidirectionally deformed valve metal having dimensions sufficient to be divided to form a plurality of sputter targets, comprising:

a first deforming of an ingot to form a preform slab having a first dimension, a second dimension normal to said first dimension, and a third dimension normal to said second dimension that is less than both said first and said second dimensions; and a second deforming of said preform slab by increasing said third dimension and decreasing said second dimension such that said second dimension is made to be less than said third dimension to form an intermediate slab, wherein said intermediate slab has an average grain size of less than about 250 microns.

2. The method of claim 1, further comprising partitioning said intermediate slab to form a plurality of rolling slabs.

3. The method of claim 1, wherein said intermediate slab has a texture that is substantially void of textural bands.

4. The method of claim 1, further comprising annealing said preform slab.

5. The method of claim 1, further comprising annealing said intermediate slab.

6. The method of claim 1, wherein said ingot is tantalum or niobium.

7. The method of claim 1, wherein said ingot is formed by electron beam melting and casting.

8. The method of claim 1, wherein said first deforming comprises forging, rolling, or any combination thereof.

9. The method of claim 1, wherein said second deforming comprises forging, rolling, bloom rolling, or any combination thereof.

10. The method of claim 1, wherein said second deforming comprises decreasing said second dimension by about 25 to about 80%.

11. The rolling slab formed by the method of claim 2, wherein said rolling slab has an average grain size of about 100 microns or less.

12. The rolling slab formed by the method of claim 2, wherein said rolling slab has an average grain size of about 50 microns or less.

13. A method of producing a multidirectionally deformed valve metal having dimensions sufficient to be divided to form a plurality of sputter targets, comprising:
   a first deforming of an ingot to form a preform slab having a first dimension, a second dimension normal to said first dimension, and a third dimension normal to said second dimension that is less than both said first dimension and said second dimension;
   a second deforming of said preform slab to form a rod, wherein said rod has an average grain size of less than about 250 microns; and
   partitioning said rod to form a plurality of billets.

14. The method of claim 13, wherein said rod has a texture that is substantially void of textural bands.

15. The method of claim 13, further comprising annealing said preform slab.

16. The method of claim 13, further comprising annealing said rod.

17. The method of claim 13, wherein said ingot is tantalum or niobium.

18. The method of claim 13, wherein said ingot is formed by electron beam melting and casting.

19. The method of claim 13, wherein said first deforming and said second deforming comprises forging, rolling, or any combination thereof.

20. The billets formed by the method of claim 13, wherein said billets have an average grain size of about 100 microns or less.

21. The billets formed by the method of claim 13, wherein said billets have an average grain size of about 50 microns or less.

22. A method of producing a multidirectionally deformed valve metal having dimensions sufficient to be divided to form a plurality of sputter targets, comprising:
   a first deforming of an ingot to form a preform slab having a first dimension, a second dimension normal to said first dimension, and a third dimension normal to said second dimension that is less than both said first dimension and said second dimension;
   partitioning said preform slab transversely to said first dimension to form a plurality of intermediate slabs, wherein each intermediate slab has a first dimension that is less than said first dimension of said preform slab, a second dimension normal to said first dimension of said intermediate slab, and a third dimension normal to said second dimension of said intermediate slab that is less than both said first dimension and said second dimension of said preform slab; and
   a second deforming of at least one of said intermediate slabs by increasing said third dimension of said at least one intermediate slab and decreasing said first dimension of said at least one intermediate slab such that said first dimension of said at least one intermediate slab is made to be less than said third dimension of said at least one intermediate slab to form a rolling slab, wherein said rolling slab has an average grain size of less than about 250 microns.

23. The method of claim 22, wherein said rolling slab has a texture that is substantially void of textural bands.

24. The method of claim 22, further comprising annealing said preform slab.

25. The method of claim 22, further comprising annealing said at least of said intermediate slabs.

26. The method of claim 22, wherein said ingot is tantalum or niobium.

27. The method of claim 22, wherein said ingot is formed by electron beam melting and casting.

28. The method of claim 22, wherein said first deforming and said second deforming comprises forging, rolling, or any combination thereof.

29. The method of claim 22, wherein said second deforming comprises decreasing said first dimension of said intermediate slab by about 25 to about 80%.

30. The rolling slab formed by the method of claim 22, wherein said rolling slab has an average grain size of from about 100 microns or less.

31. The rolling slab formed by the method of claim 22, wherein said rolling slab has an average grain size of about 50 microns or less.

32. The method of claim 1, wherein said intermediate slab has a uniform texture throughout the thickness.

33. The method of claim 1, wherein said intermediate slab has a primary (111), a primary (100), or a mixed (111)(100) texture on the surface and/or throughout the thickness.

34. The method of claim 13, wherein said rod has a uniform texture throughout the thickness.

35. The method of claim 13, wherein said rod has a primary (111), a primary (100), or a mixed (111)(100) texture on the surface and/or throughout the thickness.

36. The method of claim 22, wherein said rolling slab has a uniform texture throughout the thickness.

37. The method of claim 22, wherein said rolling slab has a primary (111), a primary (100), or a mixed (111)(100) texture on the surface and/or throughout the thickness.

* * * * *